United States Patent [19]

Park

[11] Patent Number: 6,122,761
[45] Date of Patent: Sep. 19, 2000

[54] IC CHIP TESTER USING COMPRESSED DIGITAL TEST DATA AND A METHOD FOR TESTING IC CHIP USING THE TESTER

[75] Inventor: Sang Gon Park, Seoul, Rep. of Korea

[73] Assignee: Samsung Electronics Co., Ltd., Suwon, Rep. of Korea

[21] Appl. No.: 09/140,448

[22] Filed: Aug. 26, 1998

[30] Foreign Application Priority Data

Aug. 26, 1997 [KR] Rep. of Korea ........................ 97-41218

[51] Int. Cl.⁷ .................................................. G01R 31/28
[52] U.S. Cl. ............................................................ 714/724
[58] Field of Search .................................... 714/724, 738, 714/718; 324/158.1, 73.1, 76.11

[56] References Cited

U.S. PATENT DOCUMENTS

| | | | |
|---|---|---|---|
| 4,860,260 | 8/1989 | Saito et al. ............................... | 365/201 |
| 4,875,210 | 10/1989 | Russo et al. ............................. | 714/738 |
| 5,606,568 | 2/1997 | Sudweeks ................................. | 714/738 |
| 5,894,484 | 4/1999 | Illes et al. ............................... | 714/738 |

*Primary Examiner*—Hoa T. Nguyen
*Attorney, Agent, or Firm*—Burns, Doane, Swecker & Mathis, L.L.P.

[57] ABSTRACT

Disclosed are a tester for testing an IC chip using test data consisting of many test vectors and a method for testing an IC chip using the tester. The tester has a pin memory, a sequencer memory, and a driving part. The pin memory stores many data blocks. Each of the test blocks is a combination of one or more test vector, and is repeated at least one time in the test data. The sequencer memory stores information about a designation order of the test blocks for restoring the test data. The driving part drives the pin memory so that the test blocks stored therein are output successively according to the designation order stored in the sequencer memory. The tester does not require an additional CPU, and the programming therefor is simple.

6 Claims, 5 Drawing Sheets

TABLE 1.

| | ADDRESS | TEST VECTORS | INITIAL ADDRESS | LENGTH | SIGN |
|---|---|---|---|---|---|
| FIRST TEST BLOCK | 140<br>141<br>.<br>.<br>147 | 0 1 0 0 0 1 0 0<br>0 1 0 1 0 0 0 0<br>.<br>.<br>0 0 1 0 0 1 0 0 | 140 | 8 | (140, 8) |
| SECOND TEST BLOCK | 200<br>201<br>202<br>.<br>.<br>211 | 1 0 0 1 1 0 1 0 0 0 0 0<br>1 1 0 1 1 0 1 0 0 0 0 0<br>0 1 1 0 1 0 1 0 0 0 0 0<br>.<br>.<br>0 1 1 1 0 1 0 1 0 0 0 0 | 200 | 12 | (200, 12) |
| THIRD TEST BLOCK | 450<br>450<br>.<br>.<br>450 | 0 1 1 0 1<br>0 0 1 1 1<br>.<br>.<br>0 1 1 0 1 | 450 | 5 | (140, 5) |

TEST VECTOR

FIG. 6

TABLE 2.

| PROGRAM POINTER | ADDRESS RAM | LENGTH RAM |
|---|---|---|
| 1 | 200 | 4 |
| 2 | 320 | 3 |
| .... | .... | .... |

FIG. 7

TABLE 3.

| PROGRAM POINTER | ADDRESS RAM | LENGTH RAM |
|---|---|---|
| 1 | 200 | 4 |
| 2 | 201 | 3 |
| 3 | 202 | 2 |
| 4 | 203 | 1 |
| 5 | 320 | 3 |
| 6 | 321 | 2 |
| 7 | 322 | 1 |
| .... | .... | .... |

IC CHIP TESTER USING COMPRESSED DIGITAL TEST DATA AND A METHOD FOR TESTING IC CHIP USING THE TESTER

BACKGROUND OF THE INVENTION

1. Field of the Invention

The present invention relates to an IC chip tester and a method for testing an IC chip. More particularly, the present invention relates to an IC chip tester and a method for testing an IC chip, in which test vectors in digital test data are grouped into a plurality of test blocks, and the test data are restored by outputting the test blocks successively.

2. Prior Art

A PCB (Printed Circuit Board) used in electrical appliances has a plurality of IC chips for processing digital signals. The IC chips are connected electrically with each other in the PCB. The connection state and defect of the IC chip are tested by a separate IC chip tester.

Such an IC chip tester inputs test digital signals into the IC chip, and compares the output digital signals of the IC caused by the input signals with predetermined reference signals. The IC chip tester judges normality of the IC chip on the basis of the comparison result.

The IC chip tester inputs test digital signals into the entire PCB, or into a specific digital element in the PCB. In other words according to the object of testing, the test digital signals may be input to the entire PCB or to the specific element in the PCB. The tester for inspecting normality of a specific element is called an In-circuit Tester, and a tester for inspecting the entire PCB or a large block in the PCB is called a Functional Tester.

The recent PCB includes IC chips having high integration degree such as an LSI (large scale integration) and a VLSI (very large scale integration). Such an IC chip has a lot of pins for inputting and outputting digital signals. In order to test such a complex IC chip, very long and complex digital signals as shown in FIG. 1 should be input to the input pins of the IC chips, and such signals are called test data.

One example of the test data is shown in FIG. 2. The test data are also called test pattern, and are expressed by a matrix as shown in FIG. 2. Each of the rows shows data input successively to each of the input pins of the IC chip, and each of the column shows data generated at every clock. Thus, the number of the rows corresponds to the number of input pins of the IC chip, and each of the columns is called test vector. In order to test the IC chip, respective test vectors are successively input to the input pins at every clock.

Most IC chip tester stores the test data into a memory therein, and then generates the test vectors successively at every clock. In general a complex VLSI has hundreds of input and output pins, and the test data comprises thousands of or more test vectors. Accordingly, in order to test a complex IC chip, a memory having a great capacity enough to store a large quantity of test data should be equipped, which causes a voluminous tester and high cost.

In order to overcome such problems, a variety of methods for reducing required capacity of a memory by compressing the test data have been proposed. The compressed test data are stored in the memory, and the compressed test data are converted to the original test data when the IC chip is tested. The IC chip testers necessarily employ a variety of methods for compressing the test data, and the performance and cost of the IC chip tester depend on the efficiency for compressing the test data.

A typical example of the method for compressing the test data is disclosed in U.S. Pat. No. 4,652,814 of Hewlett-Packard. FIG. 3 is a block diagram of the IC chip tester disclosed in U.S. Pat. No. 4,652,814 of Hewlett-Packard. The disclosed Patent employs the method for substituting a part occurring often for a short code, and expresses the entire test data with the substituted codes.

Referring to FIG. 3, test vectors are output from pin driver circuits, and test data are stored in local test data RAMs. The number of pin driver circuits is the same with that of the input pins of the IC chip, and the pin driver circuits are connected to the input pins of the IC chip, respectively. The number of local test data RAMs is also the same with that of the input pins of the IC chip. Thus, the data stored in each of the local test data RAMs correspond to the rows of the test data, and the number of the local test data RAMs is the same with that of the rows of the test data.

In the local test data RAMs, not all the test vectors are stored according to the output order thereof, but one test vector among test vectors identical to each other is stored only one time. Therefore, all of the test vectors stored in the local test data RAMs are different from each other. If one of the test vectors is repeated many times in the test data, that test vector stored in the local test data RAMs is repeatedly utilized. Accordingly, identical test vectors are not repeatedly stored, and thereby the quantity of the entire test data can be greatly reduced.

As such, since only the unique test vectors that are not repeated are stored in the local test data RAMs, an additional device for restoring the test data by combining the test vectors has to be provided. The additional device is called a sequencer.

The sequencer comprises a CPU, a program RAM, a counted/register, a priority encoder, an encoder RAM, and a MUX.

The encoder RAM stores addresses of the respective test vectors stored in the local test data RAMs. A specific test vector in the local test data RAM can be output repeatedly using the addresses.

The counter/register controls encoder RAM through the priority encoder. The counter/register can memorize a specific position of the encoder RAM, and repeatedly use a specific block of the test vectors through the address stored in the encoder RAM. Thus, the counter/register is used when a block consisting of a few test vectors has to be used.

The CPU controls all of the devices in the sequencer. The commands used in the CPU are stored in the program RAM.

A worker stores the test vectors which are not repeated into the local test data RAMs, and stores respective addresses of the test vectors into the encoder RAM. Then, the worker stores the overall control order into the program RAM. Therefore, when the IC chip is tested, the CPU controls the encoder RAM according to the order stored in the program RAM so that the required test vectors are successively output among the test vectors stored in the local test data RAMs. Accordingly, the original test data are restored, and the restored test data are input to the IC chip after being converted by the pin driver circuits to digital signals suitable for the IC chip.

Such an IC chip tester disclosed in Patent of Hewlett-Packard provides an efficient method for compressing the test data, however, there are a few shortcomings as follows.

First, the sequencer has a CPU and thereby the constriction of the sequencer is complex. An additional clock, and ROM and RAM are indispensable for the CPU. Therefore, the whole cost of the IC chip tester increases and the construction thereof becomes complex.

Second, in order to compress the entire test data, the test data should be converted to three types of data required in the local test data RAMs, the encoder RAM, and the program RAM, so the program for converting the test data is complex, and the programming thereof is not easy.

SUMMARY OF THE INVENTION

The present invention has been proposed to overcome the above-described problems in the prior art, and accordingly it is the object of the present invention to provide an IC chip tester which has a simple construction without a CPU, and of which programming for compressing test data is easy.

Another object of the present invention is to provide a method for testing an IC chip using such an IC chip tester.

To achieve the above object, the present invention provides a tester for testing an IC chip using test data consisting of a plurality of test vectors, the tester comprising: a pin memory for storing a plurality of test blocks, the test blocks each of which is a combination of at least one test vector among the test vectors and is repeated at least one time in the test data; a sequencer memory for storing information about a designation order of the test blocks for restoring the test data; and a driving part for driving the pin memory so that the test blocks stored in the pin memory are output successively according to the designation order stored in the sequencer memory.

It is preferable that the sequencer memory comprises: an address memory for storing initial addresses which are addresses of first test vectors of respective test blocks, according to the designation order; and a length memory for storing information about the number of the test vectors in the test block designated by the initial address, according to the designation order.

It is even more preferable that the driving part comprises: an address counter to which the initial address is input from the address memory, the address counter for designating addresses of the test vectors stored in the pin memory; a length counter to which the information about the number of the test vectors is input from the length memory, the length counter for successively changing a value of the address counter as much as a value input thereto so that all of the test vectors in one test block are successively designated by the address counter; and a program pointer for driving the address memory and the length memory so that next information in the address memory and the length memory are respectively input to the address counter and the length counter after the designation of all of the test vectors in one test block has been completed.

To achieve the above another object, the present invention provides a method for testing an IC chip comprising the steps of: determining a plurality of test blocks, the test blocks each of which is a combination of at least one test vector among the test vectors and is repeated at least one time in the test data; setting a designation order of the test blocks for restoring the test data; restoring the test data by outputting the test blocks successively according to the designation order; inputting the restored test data to the IC chip; and judging whether the IC chip is normal or not by comparing output data of the IC chip caused by the test data with reference data.

According to the present invention, since the test data are grouped into a plurality of test blocks, and the test blocks are repeatedly utilized, the entire test data need not be stored and thereby memory is saved. Furthermore, the respective test blocks are expressed merely with the initial addresses and lengths thereof, and the entire test data are restored easily according to the storage order of the initial addresses and the lengths.

Therefore, the IC chip tester does not require an additional CPU for restoring the test data, and the programming therefor is simple. Moreover, the cost of the IC chip tester is low.

BRIEF DESCRIPTION OF THE DRAWINGS

The present invention will be better understood and its various objects and advantages will be more fully appreciated from the following description taken in conjunction with the accompanying drawings, in which:

FIG. 6 is a table showing an example of values stored in a sequencer RAM of the IC chip tester according to the present invention; and FIG. 7 is a table showing an example of values of an address counter and a length counter caused by the values of the sequencer RAM shown in FIG. 6.

DETAILED DESCRIPTION OF THE PREFERRED EMBODIMENT

Hereinafter, the present invention will be described in detail with reference to the accompanying drawings.

At first, a method for grouping test data is described, which is for determining test blocks stored in pin RAMs in the IC chip tester according to the present invention which will be described later.

The test data are expressed by a matrix as described above. Each of the rows shows data input successively to each of the input pins of the IC chip, and each of the column shows data generated at every clock. Thus, the number of the rows corresponds to the number of input pins of the IC chip, and each of the columns is called a test vector.

The test data are classified into a plurality of test blocks. Each of the test blocks comprises one or more test vectors. In the test data, a combination consisting of many test vectors is repeatedly shown at least one time, and the repeated combination of the test vectors is determined to a test block.

Figure 1:
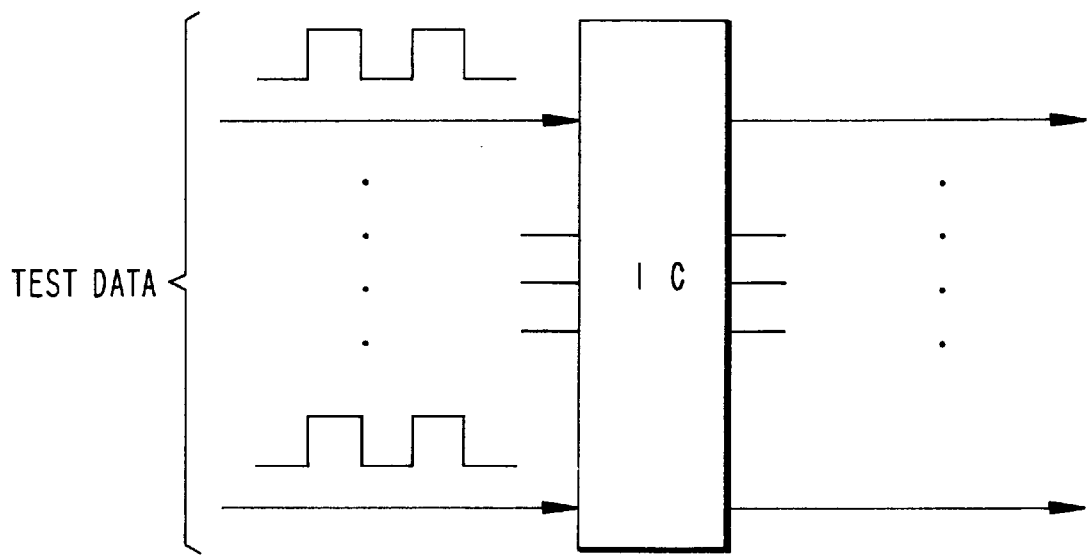
FIG. 1 is a schematic view of an IC chip, for showing a state that test data are input to a general IC chip.
Figure 2:
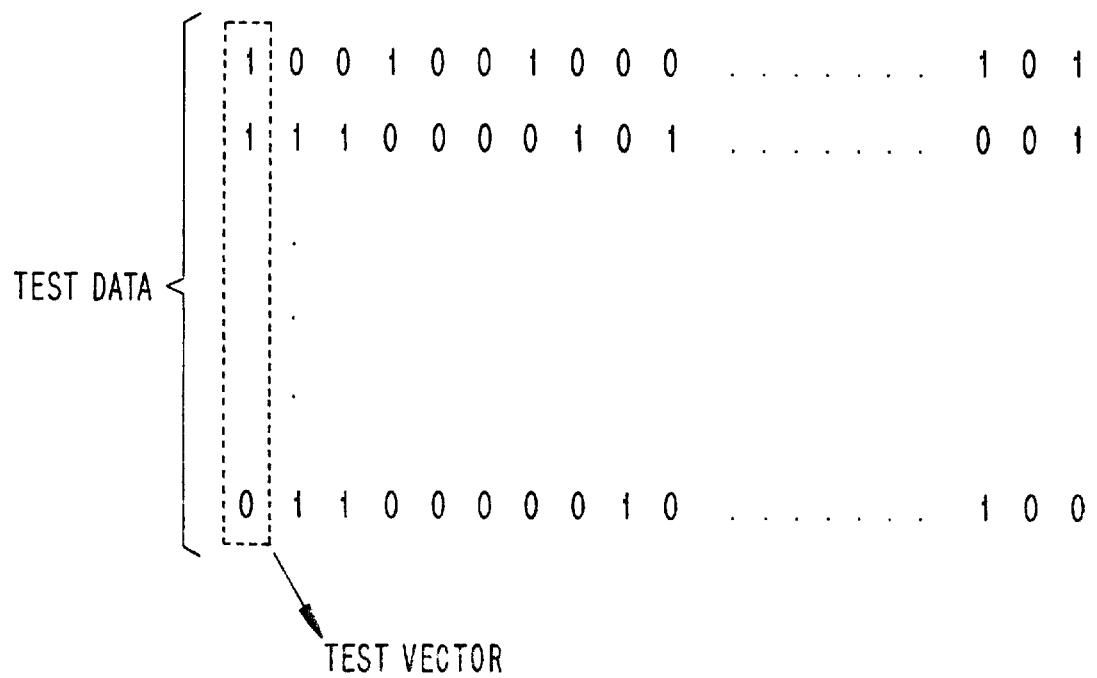
FIG. 2 shows an example of test data for use in testing an IC chip.
Figure 3:
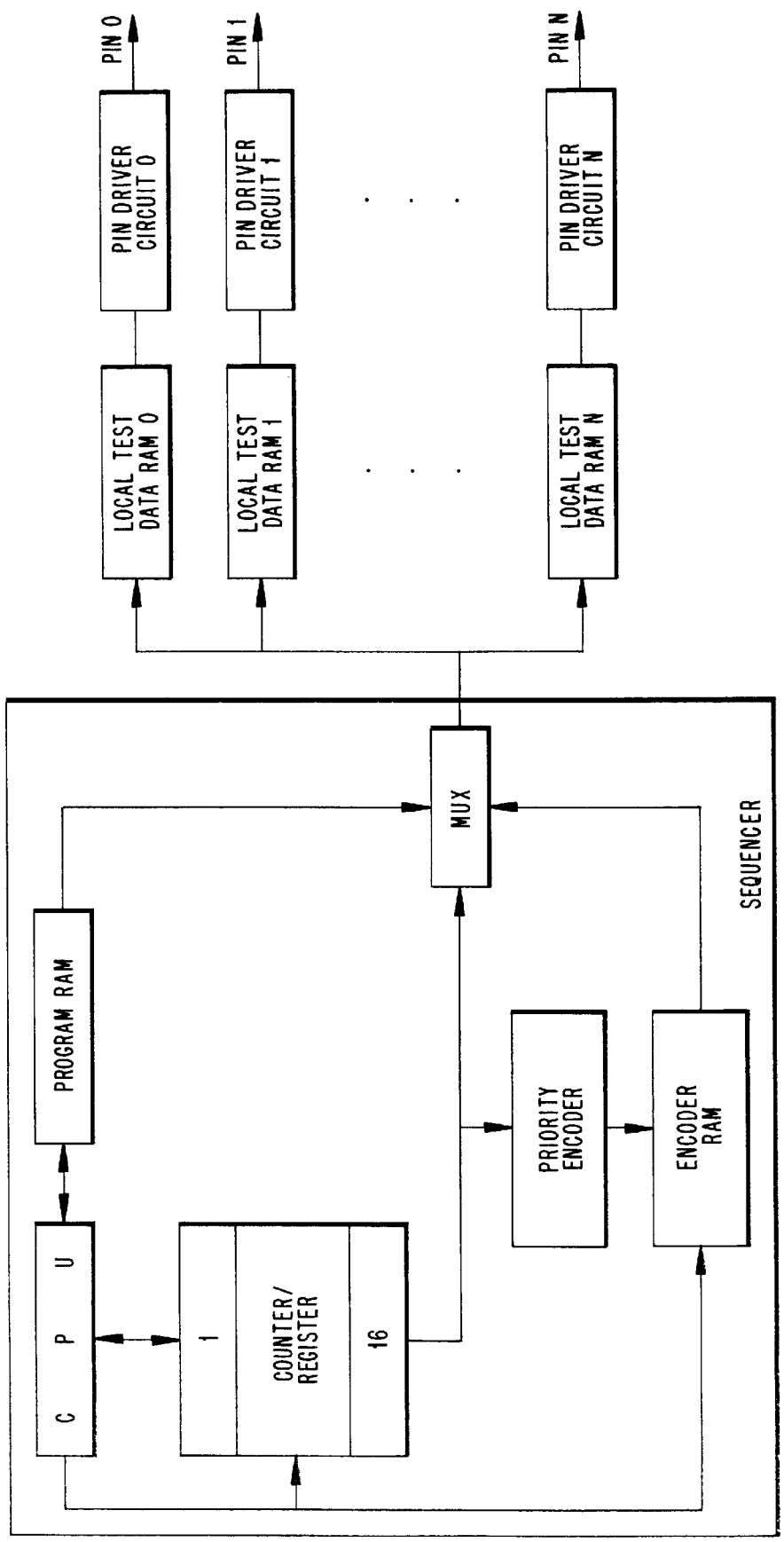
FIG. 3 is a block diagram of a conventional IC chip tester.
Figure 4:
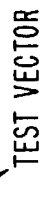
FIG. 4 is a table showing an example of test blocks employed in an IC chip tester according to the present invention.

An example of test blocks is shown in table 1 in FIG. 4. For example, as shown in table 1, if a combination of eight test vectors to which address 140 through address 147 are successively given is shown at least one time in the test data, such test vectors are determined to one test block, for example the first test block. Similarly, if a combination of twelve test vectors to which address 200 through address 211 are successively given is shown at least one time in the test data, such test vectors are determined to another test block, for example the second test block. Further, if a combination of five test vectors which merely consists of test vectors to which address 450 is given is shown at least one time in the test data, such test vectors are determined to still another test block, for example the third test block.

The test blocks determined as such can be expressed in a simple fashion using merely initial address and the length of the test block as follows.

(140, 8)→140, 141, 142, 143, 144, 145, 146, 147,
(200, 12)→200, 201, . . . , 210, 211
(450, 5)→450, 450, 450, 450, 450

The left parameter in the parenthesis designates the initial address of the test block, and tie right parameter designates the length of the test block. An underline is attached to the number designating the length of the third test block. The underline means the repetition of the identical addresses. According to such a fashion, one test block can be expressed by merely designating the initial address and the length thereof. In such a situation, a part which has been already used in a test block, i. e., one or more test vectors in a test block, can be used again in other test blocks. For example, an additional designation of another test block as follows is possible.

(201, 3)→201, 202, 203

Here, the address 201 through 203 is a part of the tester vectors constituting the second test block. Such a test block can be determined to, for example, the fourth test block. Accordingly, the test vectors having been used in a test blocks can also be determined to another test block if a combination consisting of at least one them is used again at least one time in other part of the test data.

Furthermore, one address is generally given to one tester vector repeatedly shown in the test data, however, if one test vector is used in a plurality of test blocks, a plurality of address may be given to the identical test vectors.

In other words, referring to table 1, address 141 in the first test block and address 202 in the second test block designate identical test vectors. Consequently, two addresses are given to one test vector. According to such a fashion, the required capacity for storing the test vectors increases since one test vector may be stored many times, however, there is an advantage that the test blocks can be determined more easily.

For example, if the first test block and the second test block are repeated in the test data, the test block consisting of many test vectors can be easily established by giving two addresses, i. e., address 141 and address 202 to one test vector as shown in table 1. Therefore, the overall compression efficiency more increases, and programming therefor becomes more easy.

In grouping the test data into a plurality of test blocks, it is preferable that the test blocks are determined so that one combination of test vectors is repeated in the test data as many times as possible. Furthermore, in order to make such a determination of test vectors possible, the order that the addresses are given to the test vectors need not depend on the original order of test vectors in the test data, but it is preferable that the addresses are given so that the greatest number of test blocks can be established, and the respective test blocks are repeated as many times as possible.

Furthermore, it is even more preferable if the order of the addresses of the respective test vectors is determined so that a part of one test block can be easily used in establishing other test blocks. For example, if a test block Z consisting of test vectors positioned at the rear part of one test block X and test vectors positioned at the front part of another test block Y is repeated many times in the test data, in order to establish such a test block Z easily, the test block Y is preferably positioned just after the test block X. According to such a manner, even though the test block Z is not stored separately in memory, the test block Z can be easily established using merely the initial address and the length thereof.

Accordingly, the entire test data need not be stored in the pin RAMs which will be illustrated later, and a repeated test block is stored only one time or need not be stored separately. Therefore, all the information of the entire test data can be stored to the pin RAMs of small capacity. Such test blocks are output by the IC chip tester of the present invention so that the original test data are restored, and the testing of the IC chip is performed by inputting the restored test data into the IC chip.

Figure 5:
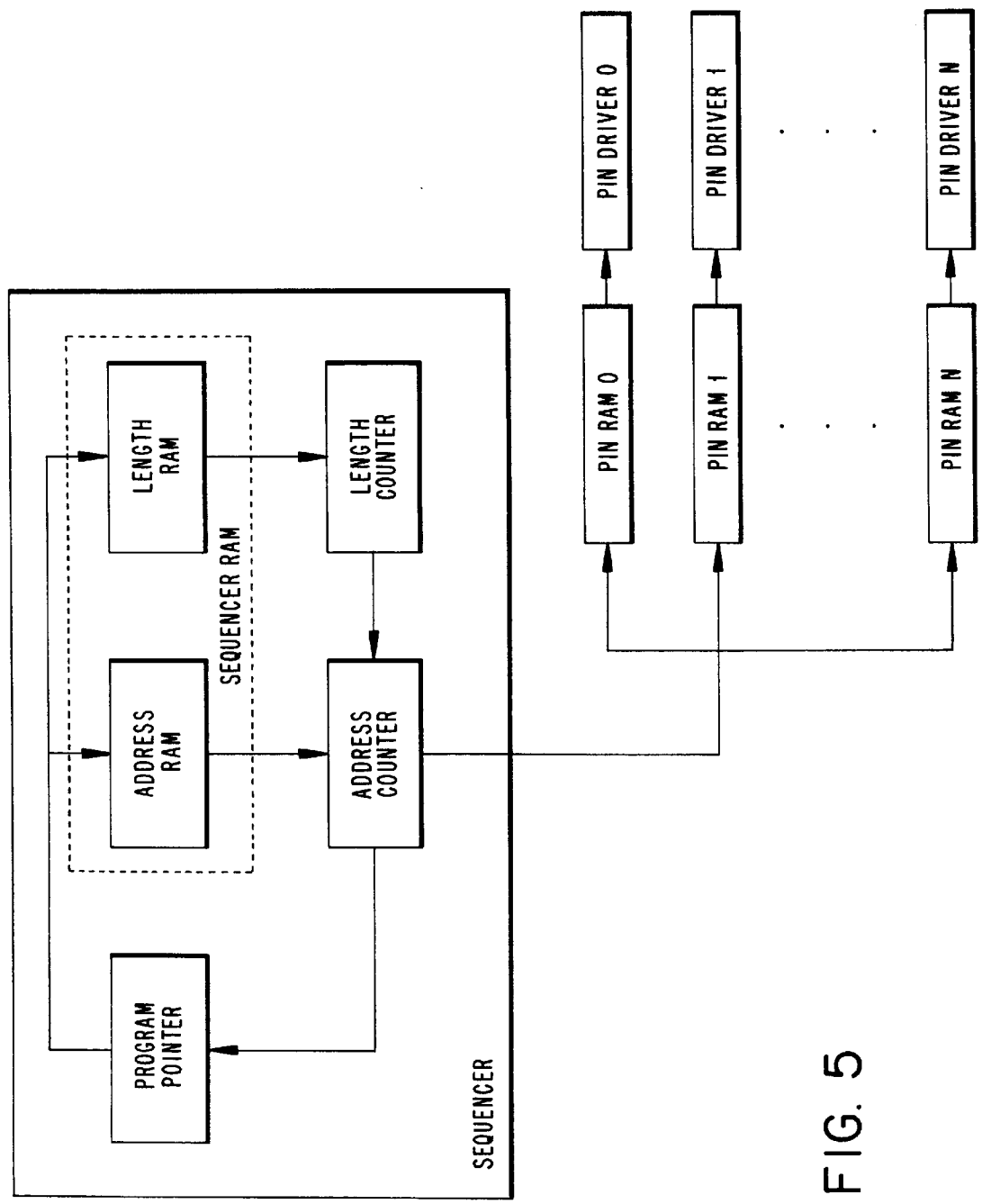
FIG. 5 is a block diagram of the IC chip tester according to the present invention.

FIG. 5 is a block diagram of the IC chip tester according to the present invention. The IC chip tester according to the present invention comprises a plurality of pin RAMs, a plurality of pin drivers, and a sequencer.

The pin drivers are connected to the input pins of an IC chip to be tested. The number of the pin drivers are the same with that of the input pins of the IC chip, and the test vectors are successively output through the pin drivers.

A plurality of test vectors to which addresses are given respectively according to the above-described manner are stored in the pin RAMs. The number of pin RAMs is equal to that of the input pins of the IC chip. Thus, the data stored in one pin RAM correspond to the row of the test data, and the number of pin RAMs is equal to that of the rows of the test data.

The sequencer includes a sequencer RAM, an address counter, a length counter, and a program pointer. Furthermore, the sequencer has a clock for driving such devices in the sequencer, which is not shown in the figure.

The sequencer RAM consists of an address RAM and a length RAM. The sequencer RAM stores the information about the test blocks. That is, the address RAM in the sequencer RAM stores the initial addresses of respective test blocks, and the length RAM stores information about the length of respective test blocks.

The address RAM stores the initial addresses according to the order that the test data are restored thereby.

The address counter receives an initial address of a test block from the address RAM. The address counter designates the addresses of the test vectors stored in the pin RAMs, and the test vector corresponding to the designated address is output from the pin RAMs to the pin drivers.

The length counter receives the information about the length of a test block from the length RAM. After the length counter receives the information about the length of the test block, it decreases the value stored therein at every clock. Simultaneously, the address counter successively increases the value stored therein at every clock while the value of the length counter is not zero. Therefore, the value of the address counter increases successively as much as the number input to the length RAM, and thereby all of the test vectors in one test block are successively designated by the address counter.

The program pointer designates the present positions of the address RAM and the length RAM. After the address counter has designated all of the test vectors in one test block, the program pointer drives the address RAM and the length RAM so that the next informations in the address RAM and the length RAM are input to the address counter and the length counter. That is, if the value of the length counter becomes zero, the value of the program pointer increases, and thereby the information about the initial address and the length of a new test block are output from the address RAM and the length RAM respectively, and then input to the address counter and the length counter respectively.

For example, if the values of the address RAM and the length RAM are given as shown in table 2 in FIG. 6, the values of the address counter, the length counter, and the program pointer will vary just like table 3 in FIG. 7.

The values of the address counter are input to the pin RAMs successively at every clock, and the pin RAMs output the test vectors corresponding to the addresses input thereto successively among the test vectors stored therein. The test vectors output from the pin RAMs are converted by the pin drivers to signals suitable for the IC chip, and then the converted signals are input to the input pins of the IC chip. The output signal of the IC chips caused by the input signals are compared with predetermined reference signals, and the normality of the IC chip is judged on the basis of the comparison result.

According to the present invention, since the test data are grouped into a plurality of test blocks, and the test blocks are repeatedly utilized, the entire test data need not be stored and thereby memory is saved. Furthermore, the respective test blocks are expressed merely with the initial addresses and lengths thereof, and the entire test data are restored easily according to the storage order of the initial addresses and the lengths.

The IC chip tester according to the present invention does not require an additional CPU for restoring the test data, and the programming therefor is simple. Moreover, the cost of the IC chip tester is low.

Although the present invention has been described and illustrated in detail, it is clearly understood that the same is by way of illustration and example only and is not to be taken by way of limitation, wherein the spirit and scope of the present invention is limited only by the terms of the appended claims.

What is claimed is:

1. A tester for testing an IC chip using test data consisting of a plurality of test vectors, the tester comprising:

a pin memory for storing a plurality of test blocks, the test blocks each of which is a combination of at least one test vector among the test vectors and is repeated at least one time in the test data;

a sequencer memory for storing information about a designation order of the test blocks for restoring the test data; and a driving part for driving the pin memory so that the test blocks stored in the pin memory are output successively according to the designation order stored in the sequencer memory.

2. The tester for testing an IC chip as claimed in claim 1, wherein the sequencer memory comprises:

an address memory for storing initial addresses which are addresses of first test vectors of respective test blocks, according to the designation order; and a length memory for storing information about the number of the test vectors in the test block designated by the initial address, according to the designation order.

3. The tester for testing an IC chip as claimed in claim 2, wherein the driving part comprises:

an address counter to which the initial address is input from the address memory, the address counter for designating addresses of the test vectors stored in the pin memory;

a length counter to which the information about the number of the test vectors is input from the length memory, the length counter for successively changing a value of the address counter as much as a value input thereto so that all of the test vectors in one test block are successively designated by the address counter; and a program pointer for driving the address memory and the length memory so that next information in the address memory and the length memory are respectively input to the address counter and the length counter after the designation of all of the test vectors in one test block has been completed.

4. The tester for testing an IC chip as claimed in claim 1, wherein the pin memory comprises a plurality of RAMs, wherein the number of the RAMs is identical to that of bits of the test vector.

5. The tester for testing an IC chip as claimed in claim 1, further comprising a pin driver for converting the test data output from the pin memory to signals suitable for the IC chip.

6. A method for testing an IC chip using test data consisting of a plurality of test vectors, the method comprising the steps of:

determining a plurality of test blocks, the test blocks each of which is a combination of at least one test vector among the test vectors and is repeated at least one time in the test data;

setting a designation order of the test blocks for restoring the test data;

restoring the test data by outputting the test blocks successively according to the designation order;

inputting the restored test data to the IC chip; and judging whether the IC chip is normal or not by comparing output data of the IC chip caused by the test data with reference data.

* * * * *